Oct. 9, 1962 R. W. FRITTS 3,057,940

THERMOELECTRIC GENERATOR

Filed June 17, 1960

INVENTOR
ROBERT W. FRITTS
BY
Carpenter Abbott Coulter & Kinney
ATTORNEYS 3,057,940
Patented Oct. 9, 1962

3,057,940

THERMOELECTRIC GENERATOR

Robert W. Fritts, Arden Hills, Minn., assignor to Minnesota Mining and Manufacturing Company, St. Paul, Minn., a corporation of Delaware Filed June 17, 1960, Ser. No. 36,842
9 Claims. (Cl. 136—4)

Figure 1:
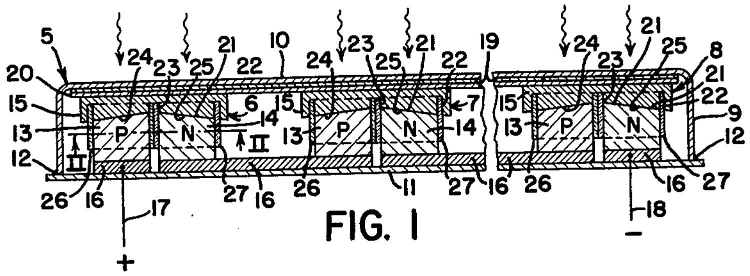

This invention relates to improvements in thermoelectric generators. Thermoelectric generators utilizing semiconductor elements perform most efficiently when the hot junction temperatures are maintained as high as possible consistent with the physical and chemical properties of the semiconducting materials. Most of the efficient thermoelectrical materials known today are brittle in nature and are subject to plastic deformation and/or partial vaporization at high temperatures at which they exhibit attractive thermoelectric properties. These characteristics severely complicate the development of thermoelectric generators, for example thermopile structures, utilizing a plurality of semiconductor thermoelements connected in series circuit relation, by metallic thermojunction members.

Oxidation resistant alloys are commonly used for thermopile enclosures, and the relatively high thermal expansion coefficients of these materials tends to cause, during thermal cycling, transverse intercouple thermal displacement which develops transverse shear stresses which can mechanically damage the semiconductor thermoelements. The thermoelements may be further subjected to transverse shear stresses as a result of differential thermal expansion of the hot thermojunction members and the cold thermojunction members. Upon thermal cycling of the generator, the expansion and contraction of the hot thermojunction members tends to move the ends of the thermoelements joined thereto a substantially greater distance toward and away from each other than the cold ends of said thermoelements tend to be moved by thermal expansion of the cold thermojunction members. High temperature vaporization of the semiconductor materials adjacent the hot junctions of the generator tends to cause cross contamination of adjacent P and N type thermoelements which has an adverse effect upon the thermoelectric properties thereof. Plastic deformation or creep of the semiconducting materials at high operating temperatures causes distortion of the thermoelements tending to damage the electrical connections thereto or cause short circuiting between adjacent thermoelements.

With the above in mind a principal object of the present invention is to provide an improved thermoelectric generator having semiconductor thermoelements, said generator being so constructed that thermal distortional stresses imposed on the thermoelements during operation are reduced to a minimum.

Another principal object of the invention is to provide an improved thermoelectric generator of the aforementioned character in which plastic deformation and vaporization of the thermoelements are minimized.

Another more specific object of the invention is to provide a thermoelectric generator of the class described having a novel thermoelement-hot thermojunction electrode structure affording minimization of transverse stresses tending to cause distortion of the thermoelements as a result of thermal expansion and contraction of the hot thermojunction members.

Another specific object of the invention is to provide an improved thermoelectric generator structure as aforesaid in which the tendency of thermal expansion and contraction of the enclosure thereof to cause intercouple displacement is minimized.

Figure 2:
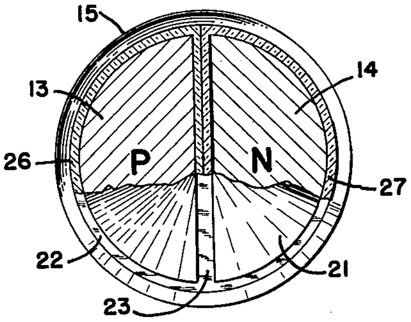

Other and further objects and advantages of the invention will become apparent as the description proceeds, reference being had to the accompanying drawing which is not necessarily to scale, in which:

FIGURE 1 is a vertical sectional view taken through a thermoelectric generator constructed in accordance with the principles of the invention, parts being broken away; and FIGURE 2 is an enlarged transverse sectional view taken along the lines II—II of FIGURE 1, parts being broken away.

Referring more particularly to FIGURE 1 of the drawing, the form of the invention selected for illustration therein comprises a thermoelectric generator designated generally by the numeral 5 and comprising a plurality of series connected thermocouples, three of which, indicated by the numerals 6, 7 and 8, are shown. The thermocouples are enclosed within an hermetically sealed casing comprising a thin gauge pan-shaped metallic member 9 of oxidation resistant alloy, for example stainless steel, having a flat wall portion 10. The aforementioned casing also includes a flat plate member 11 which may be made of the same material as the member 9 and is peripherally sealed thereto as by welding at 12.

Each of the thermocouples comprises a P-type thermoelement 13 and an N-type thermoelement 14 electrically joined at one end by a hot thermojunction member 15. Electrically joined to the opposite ends of the thermoelements 13 and 14 are cold thermojunction members 16 which afford the series circuit connection between adjacent couples as well as the terminal connections for the generator 5 to which the leads therefor, shown schematically at 17 and 18, are connected.

The inner surface of the enclosure plate member 11 bears a thin electrically insulating heat conductive coating, for example an oxide coating, with which the flat outer surfaces of the cold thermojunction members 16 are in good thermal contact. Overlaying the inner surface of the flat wall portion of the pan-shaped member 9 is a thin layer 19 of heat conductive low friction material, for example a thin sheet of mica. Disposed in laminate relation with the layer 19 is a thin plate 20 of metal having a coefficient of thermal expansion which is very low and preferably substantially zero. A suitable metal for use in the plate 20 is known commercially as Invar and contains approximately 64% iron and 36% nickel. The inner surface of the plate 20 also bears a thin coating of electrically insulating and thermally conductive material, for example an oxide coating.

The hot thermojunction members 15 have flat outer surfaces in good thermal contact with the coated inner surface of the plate 20 and may be circular in shape as shown in FIGURE 2. The members 15 preferably have concave conical inner surfaces 21 each formed with a coaxial circular groove 22 and an intersecting diametrical groove 23. The thermoelements 13 and 14 are preferably semicylindrical in shape as shown in FIGURE 2, and are formed adjacent the hot thermojunction members with semiconical end surfaces 24 and 25 which are complemental to the conical inner surface of the associated hot thermojunction member 15. The thermoelements 13 and 14, for the major portion of their length, are snugly telescoped within thin semicylindrical sleeves 26 and 27 which project into and have a snug bottoming fit within the grooves 22 and 23 of the members 15. The sleeves or tubes 26 and 27 are preferably formed of an electrically insulating material exhibiting substantial high temperature strength, one such material being mica.

The junctions between the thermoelements 13 and 14 and the cold thermojunction members 16 are preferably of the bonded type, whereas the junction of said thermoelements with the hot thermojunction members 15 is preferably a non-bonded abutting contact, although a bonded type contact may be used. Means is provided for placing the thermoelements 13 and 14 under axial compression between the thermojunction members 15 and 16. In the illustrated embodiment compressive bias is impressed upon the thermoelements by evacuating the enclosure formed by the members 9 and 11 to cause the wall portion 10 and the plate member 11 to be atmospherically biased toward each other. Obviously, any other suitable biasing means, for example spring means shown in the prior art, may be utilized where suitable and desired.

In operation of the improved generator 5 the plate portion 10 of the enclosure member 9 is subjected to a source of heat indicated schematically by the wavy arrows, and the enclosure plate member 11 is contacted by a cooling medium which may, for example be atmospheric air, a cooling liquid or the like. Since the plate 20 has a coefficient of thermal expansion of substantially zero, the application of heat to the plate portion 10 of the enclosure member 9, though causing substantial thermal expansion of said plate portion, has no substantial expanding effect upon the plate 20. By virtue of the low friction character of the layer 19, relative sliding movement is permitted between said layer and the plate portion 10 upon expansion and contraction of the latter. Since the plate 20 neither expands nor contracts to any substantial degree, there is no tendency to cause any substantial transverse movement of the hot thermojunction members 15 such as would be the case if said members were in direct contact with the plate portion 10 of enclosure member 9. The plate 20 thus prevents the imposition on the thermoelements of the transverse shear stresses which, in the absence of said plate, would be caused by transverse displacement of the hot thermojunction members with thermal expansion and contraction of the plate portion 10.

In the preferred form of the invention the materials of the plate 20, the cold thermojunction members 16 and the enclosure plate 11 are chosen such that the following relationship obtains:

$$(T_2-T_0)a_2=(T_1-T_0)a_1$$

$T_2$ is the operating temperature of the plate 20 and $T_1$ is the operating temperature of the plate 11 and cold thermojunction members 16, whereas $T_0$ is the ambient temperature. The coefficient of thermal expansion of the plate 20 is represented as $a_2$, and the coefficient of thermal expansion of the wall 11 and of the cold thermojunction members 16 is represented as $a_1$. With the materials thus selected, the thermoelements tend to stay substantially parallel and free of shear stresses.

In the improved generator the tendency of thermal expansion and contraction of the hot thermojunction members 15 to impose transverse shear stresses on the themoelements engaged thereby are minimized. To this end, the hot thermojunction members 15 and the thermoelements 13 and 14 have well matched thermal expansion coefficients. The members 15 may, for example, be made of iron, and the thermoelements 13 and 14 may be made of lead telluride compositions suitably doped to provide the desired electrical characteristics. The thermoelements of each couple are placed as close together as possible, the spacing therebetween preferably being defined only by the thickness of the intervening walls of the thin sleeves 26 and 27. The conical configuration of the hot junction interfaces formed by engagement of surface 21 by surfaces 24 and 25 causes the hot junction end of the thermoelements of each couple to be pressed toward each other under the compressive bias aforementioned, so that the spacing therebetween is maintained constant and at a minimum in spite of any thermal expansion of the hot thermojunction members 15. The thermoelements are thus at all times centered, and any tendency toward splitting or cracking off of portions of the brittle thermoelement material is substantially reduced.

The sleeves 26 and 27, in addition to affording rigid supports for the thermoelements 13 and 14 resisting plastic deformation thereof at operating temperatures, also prevent vapors given off from one thermoelement at high hot junction temperatures from transferring to and contaminating adjacent thermoelements of opposite polarity. The snug fit of the sleeves 26 and 27 in the grooves 22 and 23 affords a support for said tubes, and in addition, the overlapping joint thereat provides impedance to vapor transfer of the material of the thermoelements. Extension of the sleeves 26 and 27 into a region of higher temperature than the hot junction interfaces enhances the resistance to vapor transfer since, as is well established, vapor transfer tends to take place more rapidly down a temperature gradient than in the opposite direction. The sleeves 26 and 27, being impervious to the vapor and extending into a hotter zone than the hot junction interfaces, are therefore effective to restrict vapor transfer and prevent cross contamination of adjacent thermoelements.

Having thus described a thermoelectric generator structure and organization as one specific embodiment of the present invention, it is to be understood that the illustrated form was selected to facilitate the disclosure of the invention rather than to limit the number of forms which it may assume or to confine the invention to a particular use. Various modifications, adaptations and alterations may be applied to the specific form shown to meet the requirements of practice without in any manner departing from the spirit or scope of the present invention, and all of such modifications, adaptations and alterations are contemplated as may come within the scope of the appended claims.

What is claimed as the invention is:

1. A thermoelectric generator comprising a pair of thermoelements disposed in predetermined spaced parallel relation, a thermojunction member extending transversely of and having surface portions in pressure contact relation with adjacent end surface portions of said thermoelements and adapted to be subjected to a source of heat, and means biasing said thermoelements and thermojunction member into said pressure contact relation, the coacting thermoelement-thermojunction member surface portions at said pressure contact being so formed that under the bias of said biasing means the ends of said thermoelements at said pressure contact are biased toward each other to maintain said predetermined spaced parallel relation of said thermoelements in spite of any tendency of thermal expansion of said thermojunction member to cause separating movement of the ends of said thermoelements at said pressure contact.

2. A thermoelectric generator comprising a pair of thermoelements disposed in side by side parallel relation, a thermojunction member extending transversely of and having surface portions in pressure contact relation with adjacent end surface portions of said thermoelements and adapted to be subjected to a source of heat, a relatively thin layer of insulation interposed between and defining the extent of separation of said thermoelements, and means biasing said thermoelements and thermojunction member into said pressure contact relation, the coacting thermoelement-thermojunction member surface portions at said pressure contact being so formed that under the bias of said biasing means the ends of said thermoelements at said pressure contact are biased toward each other, to maintain said thermoelements in predetermined closely spaced parallel relation in spite of any tendency of thermal expansion of said thermojunction member to cause separating movement of the ends of said thermoelements at said pressure contact.

3. A thermoelectric generator comprising a pair of thermoelements disposed in predetermined spaced parallel relation, a thermojunction member extending transversely of and having surface portions in pressure contact relation with adjacent end surface portions of said thermoelements and adapted to be subjected to a source of heat, and means biasing said thermoelements and thermojunction member into said pressure contact relation, coacting surface portions at said pressure contact extending obliquely with respect to said thermoelements in directions such that under the bias of said biasing means the ends of said thermoelements at said pressure contact are biased toward each other to maintain said predetermined spaced parallel relation of said thermoelements in spite of any tendency of thermal expansion of said thermojunction member to cause separating movement of the ends of said thermoelements at said pressure contact.

4. A thermoelectric generator comprising a pair of thermoelements disposed in side by side parallel relation and formed at one end with generally coaxial semiconical end surfaces, a thermojunction member extending transversely of and having a conically concave surface portion complemental to and in pressure contact relation with said semiconical thermoelement end surfaces, said thermojunction member being adapted to be subjected to a source of heat, and means biasing said thermoelements and thermojunction member into said pressure contact relation, the coaction of said surface portions at said pressure contact being such that under the bias of said biasing means the ends of said thermoelements at said pressure contact are biased toward each other to maintain said parallel relation of said thermoelements in spite of any tendency of thermal expansion of said thermojunction member to cause separating movement of the ends of said thermoelements at said pressure contact.

5. A thermoelectric generator comprising a pair of thermoelements disposed in side by side parallel relation and formed at one end with generally coaxial semiconical end surfaces, a thermojunction member extending transversely of and having a conically concave surface portion complemental to and in pressure contact relation with said semiconical thermoelement end surfaces, said thermojunction member being adapted to be subjected to a source of heat, a relatively thin layer of insulation interposed between and defining the extent of separation of said thermoelements, and means biasing said thermoelements and thermojunction member into said pressure contact relation, the coaction of said surface portions at said pressure contact being such that under the bias of said biasing means the ends of said thermoelements at said pressure contact are biased toward each other to maintain said parallel relation of said thermoelements in spite of any tendency of thermal expansion of said thermojunction member to cause separating movement of the ends of said thermoelements at said pressure contact.

6. A thermoelectric generator comprising a pair of similarly shaped generally coaxial semicylindrical thermoelements having generally coaxial semiconical surfaces at one end thereof, each of said thermoelements being snugly positioned within a thin semicylindrical sleeve of rigid electrical insulation, a thermojunction member formed with an annular groove and with a groove extending diametrically of said annular groove in which grooves one end of said sleeves are snugly received, said thermojunction member also being formed with generally coaxial concave semiconical surfaces respectively complemental to and in pressure contact relation with said semiconical thermoelement surfaces, said thermojunction member being adapted to be subjected to a source of heat, a pair of second thermojunction members respectively electrically joined to the opposite end of said thermoelements, and biasing means operatively associated with said thermojunction members for placing said thermoelements in compression, the coaction of said complemental semiconical surfaces at said pressure contact being such that under the bias of said biasing means the ends of said thermoelements at said pressure contact are biased toward the common axis of said thermoelements to maintain said coaxial relationship in spite of any tendency of thermal expansion of said first-mentioned thermojunction member to cause separating movement thereof, the snug fit of said sleeves in said grooves affording impedance to sublimation vapor transfer, and the rigidity of said sleeves affording impedance to plastic flow of said thermoelements.

7. A thermoelectric generator comprising a pair of thermoelements disposed in predetermined side-by-side relation, a thermojunction member extending transversely of and having surface portions in pressure contact relation with adjacent end surface portions of said thermoelements and adapted to be subjected to a source of heat, and means biasing said thermoelements and thermojunction member into said pressure contact relation, the coacting thermoelement-thermojunction member surface portions at said pressure contact being so formed that under the bias of said biasing means the ends of said thermoelements at said pressure contact are biased toward each other to maintain said predetermined side-by-side relation of said thermoelements in spite of any tendency of thermal expansion of said thermojunction member to cause separating movement of the ends of said thermoelements at said pressure contact.

8. A thermoelectric generator comprising a pair of thermoelements disposed in predetermined side-by-side relation, a thermojunction member extending transversely of and having surface portions in pressure contact relation with adjacent end surface portions of said thermoelements and adapted to be subjected to a source of heat, electrically insulating spacing means defining a predetermined minimum spacing between the ends of said thermoelements at said pressure contact, and means biasing said thermoelements and thermojunction member into said pressure contact relation, the coacting thermoelement-thermojunction member surface portions at said pressure contact being so formed that under the bias of said biasing means the ends of said thermoelements at said pressure contact are biased toward each other to maintain said predetermined minimum spacing therebetween in spite of any tendency of thermal expansion of said thermojunction member to cause separating movement of said thermoelement ends.

9. A thermoelectric generator comprising a pair of thermoelements disposed in predetermined side-by-side relation, a thermojunction member extending transversely of and having surface portions in pressure contact relation with adjacent end surface portions of said thermoelements and adapted to be subjected to a source of heat, electrically insulating spacing means defining a predetermined minimum spacing between the ends of said thermoelements at said pressure contact, and means biasing said thermoelements and thermojunction member into said pressure contact relation, said thermojunction surface portions extending obliquely with respect to said thermoelements in directions such that under the bias of said biasing means the ends of said thermoelements at said pressure contact are biased toward each other to maintain said predetermined minimum spacing therebetween in spite of any tendency of thermal expansion of said thermojunction member to cause separating movement of said thermoelement ends.

References Cited in the file of this patent

UNITED STATES PATENTS

| | | |
|---|---|---|
| 1,848,655 | Petrik | Mar. 8, 1932 |
| 2,543,331 | Okolicsanyi | Feb. 27, 1951 |
| 2,886,618 | Goldsmid | May 12, 1959 |
| 2,919,553 | Fritts | Jan. 5, 1960 |
| 2,949,497 | Jarvis et al. | Aug. 16, 1960 |

FOREIGN PATENTS

| | | |
|---|---|---|
| 242,847 | Germany | Jan. 25, 1912 |